US009040956B2

(12) United States Patent
Mehr et al.

(10) Patent No.: US 9,040,956 B2
(45) Date of Patent: May 26, 2015

(54) UNIPOLAR HETEROJUNCTION DEPLETION-LAYER TRANSISTOR

(75) Inventors: Wolfgang Mehr, Friedersdorf (DE); Gunther Lippert, Frankfurt an der Oder (DE)

(73) Assignee: IHP GmbH—INNOVATIONS FOR HIGH PERFORMANCE MICROELECTRONICS/LEIBNIZ-INSTITUT FUR INNOVATIVE MIKROELEKTRONIK, Frankfurt an der Oder (DE)

(*) Notice: Subject to any disclaimer, the term of this patent is extended or adjusted under 35 U.S.C. 154(b) by 875 days.

(21) Appl. No.: 12/998,944

(22) PCT Filed: Dec. 11, 2009

(86) PCT No.: PCT/EP2009/066958
§ 371 (c)(1),
(2), (4) Date: Sep. 2, 2011

(87) PCT Pub. No.: WO2010/072590
PCT Pub. Date: Jul. 1, 2010

(65) Prior Publication Data
US 2011/0309335 A1  Dec. 22, 2011

(30) Foreign Application Priority Data

Dec. 22, 2008 (DE) .................. 10 2008 055 100

(51) Int. Cl.
*H01L 29/872* (2006.01)
*H01L 29/16* (2006.01)
*H01L 29/737* (2006.01)
*H01L 29/76* (2006.01)

(52) U.S. Cl.
CPC ............ *H01L 29/16* (2013.01); *H01L 29/1606* (2013.01); *H01L 29/7376* (2013.01); *H01L 29/7606* (2013.01)

(58) Field of Classification Search
CPC ................................... H01L 29/7373
See application file for complete search history.

(56) References Cited

U.S. PATENT DOCUMENTS

| 5,389,798 A | 2/1995 | Ochi et al. ............. 257/25 |
| 7,015,142 B2 | 3/2006 | DeHeer et al. .......... 438/689 |
| 7,642,541 B2 * | 1/2010 | Matsui et al. ............. 257/9 |
| 2004/0232505 A1 | 11/2004 | Moddel et al. .......... 257/424 |
| 2008/0246023 A1 | 10/2008 | Zeng et al. .............. 257/25 |

FOREIGN PATENT DOCUMENTS

| JP | 2007-19086 | 1/2007 |
| WO | WO 2007/097938 | 8/2007 |

OTHER PUBLICATIONS

L.A. Ponomarenko et al.; "Chaotic Dirac Billiard in Graphene Quantum Dots"; Science Magazine; Apr. 18, 2008; pp. 356-358; vol. 320, No. 5874; AAAS.

(Continued)

*Primary Examiner* — Jerome Jackson, Jr.
(74) *Attorney, Agent, or Firm* — Ware, Fressola, Maguire & Barber LLP

(57) ABSTRACT

A depletion-layer transistor comprising a base, an emitter and a collector, in which the emitter contains a tunnel diode which permits a tunnel current of charge carriers from the emitter in the direction of the collector when an emitter-base voltage above a first threshold voltage is applied in the direction of current flow, and in which the base contains a graphene layer.

18 Claims, 3 Drawing Sheets

(56) References Cited

OTHER PUBLICATIONS

Phys. Stat. sol. (a) 205, No. 7; Ryzhii, V. et al.; "Thermionic and tunneling transport mechanisms in graphene field-effect transistors"; pp. 1527-1533; 2008.

IEEE Electron Device Letters; Zhang, Q. et al.; "Graphene Nanoribbon Tunnel Transistors"; whole document; XP-002568836; Nov. 21, 2008.

Journal of Applied Physics, vol. 102, No. 5; Liang, G. et al.; "Ballistic graphene nanoribbon metal-oxide-semiconductor field-effect transistors: A full real-space quantum transport simulation"; whole document; Sep. 11, 2007.

English abstract for JP 2007-19086.

European Patent Office; Baillet, B.; "International Search Report"; whole document; Mar. 4, 2010.

* cited by examiner

UNIPOLAR HETEROJUNCTION DEPLETION-LAYER TRANSISTOR

CROSS REFERENCE TO RELATED APPLICATIONS

This application is the U.S. National Stage of International Application No. PCT/EP2009/066958 filed on Dec. 11, 2009 which was published in German on Jul. 1, 2010 under International Publication Number WO 2010/072590, which International Application in turn claims the benefit of German Application No. DE 10 2008 055 100.7 filed Dec. 22, 2008.

BACKGROUND OF THE INVENTION

1. Technical Field

The invention relates to a depletion-layer transistor, in particular to a (unipolar heterojunction depletion-layer transistor.

2. Discussion of Related Art

Unipolar heterojunction depletion-layer transistors are used as semiconductor components in high-frequency circuits, for example in circuits for applications in broadband and wireless communications, or in radar and sensor applications.

There is a need for transistors which can be operated at signal frequencies ranging from several 100 GHz up to the THz range. Transistors deployed in industrial production until now and designed for such high frequencies use silicon-based heterojunction bipolar transistors (HBTs), for example, with a base made of a silicon-germanium alloy.

US 2004/0232505 describes a depletion-layer transistor structure having a first multilayer tunnel structure disposed between an emitter electrode and a base electrode and permitting electron transport from the emitter into the base by means of resonant tunneling. A second multilayer structure, by means of which electrons which have tunneled from the emitter into the base can tunnel through to the collector, is provided between the base and collector electrodes.

DISCLOSURE OF INVENTION

The object of the present invention is to specify an improved depletion-layer transistor which is suitable for operating frequencies up to the terahertz range.

The object is achieved by a depletion-layer transistor comprising a base, an emitter and a collector, in which the emitter contains a tunnel diode which permits a tunnel current of charge carriers from the emitter in the direction of the collector when an emitter-base voltage above a first threshold voltage is applied in the direction of current flow, and in which the base contains a graphene layer.

The invention is based on the realization that a thin metal conductive base layer acting as an electrode can control the emitter/collector current.

Graphene generally refers to a thin carbon layer with the honeycomb structure of graphite. The carbon atoms in a graphene monolayer are in a semi-planar, honeycomb-like arrangement. Compared to metal elements, graphene has the advantageous property of anisotropic electron mobility. This means that the field produced by the collector voltage acts more strongly in a preferred direction through the graphene base than is the case with metal and favors "suction" of electrons in the direction of the collector.

Under ideal conditions, graphene can be produced with a particularly high electron mobility of up to 200,000 cm$^2$/Vs, as is known from the publication Bolotin, K. I.: Ultrahigh electron mobility in suspended graphene, arXiv: 0802.2389v1, 2008. The unipolar heterojunction depletion-layer transistor according to the invention has a particularly low base resistance due to the use of a graphene layer.

This permits operation under particularly high frequencies and at the same time a substantially higher switching speed compared to known structures. In combination with the short delay time of tunneling in the emitter/base diode, the invention thus provides a transistor structure having greatly improved high-frequency characteristics.

The transistor is controlled by triggering a tunnel diode which blocks current in one direction and which permits a tunnel current in the opposite direction, the direction of flow, that essentially and simultaneously forms the emitter-collector current. In suitable configurations of the transistor according to the invention, the tunnel current in the direction of flow may be switched with operating frequencies in the terahertz range.

To summarize, it is possible with the structure according to the invention to manufacture a depletion-layer transistor for especially high frequencies.

Embodiments of the inventive depletion-layer transistor shall now be described. The additional features of the embodiments may be combined with each other to form new types of embodiment, unless they are disclosed as alternatives to each other.

The graphene layer of the depletion-layer transistor of the present invention has a thickness which ranges in different embodiments from exactly one to multiple atomic layers.

The base preferably has no other layers besides the graphene layer. In other words, in one embodiment the base consists of the graphene layer.

In another embodiment, the emitter has a multi-layer structure in the direction of the base. The multi-layer structure contains an emitter barrier layer as a tunnel barrier between the graphene layer and the emitter. This emitter barrier layer is configured to block charge carrier transport between the emitter and the graphene layer when emitter-base voltages are below the first threshold voltage, and to let a tunnel current flow between the emitter and the graphene layer when emitter-base voltages are above the threshold voltage. Using the emitter barrier layer also allows control to be exercised over characteristics of the boundary surface between the base and emitter that affect the switching speed.

A suitable material for the emitter barrier layer is silicon dioxide (SiO$_2$), or some other dielectric material. These dielectric materials, including the boundary to the emitter and base layers, have preferably very few defects.

The layer thickness of the emitter barrier layer is less than 2 nm in typical embodiments.

In another embodiment, a collector barrier layer is disposed between the graphene layer and the collector. The collector barrier layer may be configured as a dielectric barrier layer between the base and the collector. The collector barrier layer is configured in such a way that no charge-carrying current can flow between the base and the collector unless there is injection of charge carriers from the emitter.

The maximum thickness of the collector-barrier layer is approximately 8 nm in one embodiment. By selecting a suitable thickness and suitable dielectric constants, it is possible to adjust not only the maximum collector voltage, but also the base-collector capacitance. Due to the the graphene layer, it is possible for charge carriers to be injected into the conduction band of the collector barrier layer by suitably triggering the tunnel diode. In this way, it is possible to control the collector resistance.

The collector barrier layer is preferably made of a dielectric material, which may be $SiO_2$, for example, although it may also be a dielectric material having a dielectric constant that differs from the material of the emitter barrier layer. In one embodiment, the collector barrier layer made of $SiO_2$ is disposed on a silicon collector layer or on a silicon monocrystal substrate.

In another embodiment, the emitter barrier layer is made of a first dielectric material and the collector barrier layer is made of a second dielectric material, the band gap between the valence and conduction bands of the second dielectric material being either equal to or less than the band gap of the first dielectric material. For certain embodiments, it may be appropriate that the material of the collector barrier layer has a narrower band gap between the valence and conduction bands than the material of the emitter barrier layer.

Providing both an emitter barrier layer and a collector barrier layer, that is to say, both barrier layers simultaneously in the depletion-layer transistor structure, forms an advantageous embodiment but is not necessary in every application for the transistor to work. In alternative embodiments, either the emitter barrier layer or the collector barrier layer may form the only barrier layer of the depletion-layer transistor.

If the boundary between the emitter and the base is suitably formed, a Schottky diode can be produced here without an emitter barrier layer being deposited. In that case, the emitter barrier layer may be omitted.

Alternatively, a pn transition or an undoped semiconductor layer may be provided as a barrier layer between the base and the collector.

In some embodiments, the emitter layer is made of a doped first semiconductor material of a first conductivity type, and the collector is made of a metal or a doped second semiconductor material of the first conductivity type whose band gap is narrower than that of the emitter. Doping may function here as a degree of freedom in setting the band gap and the charge carrier concentration for the respective transistor. In this way, particularly high levels of charge carrier mobility can be achieved. The first semiconductor material may be silicon, for example, and the second semiconductor material may be a silicon-germanium alloy or germanium. High charge carrier mobilities are further supported when at least one of the first and second semiconductor materials is monocrystalline.

However, it is essentially possible to use polycrystalline or amorphous semiconductor materials, or semiconductor metal oxides, for the emitter and the collector.

In another, simplified, embodiment, the layer structure of the transistor contains a metallically conductive emitter, which may be made of a metal, and adjacent thereto a tunnel diode dielectric to which the graphene base directly adjoins, followed by a dielectric, for example one with a high dielectric constant (high-k dielectric), and the adjoining collector, which for its part is metallically conductive or even made of a metal.

BRIEF DESCRIPTION OF THE DRAWINGS

Embodiments of the inventive depletion-layer transistor shall now be described with reference to the drawings, in which.

DETAILED DESCRIPTION

Figure 1:
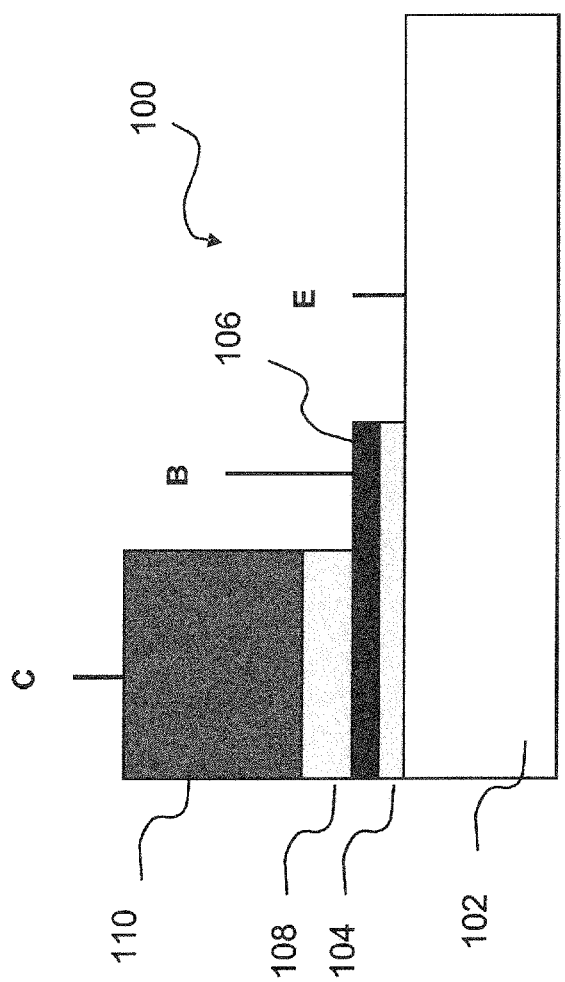
FIG. 1 shows a highly schematic cross-sectional view of an embodiment of a depletion-layer transistor according to the present invention.

FIG. 1 shows a highly schematic cross-sectional view of an embodiment of a depletion-layer transistor 100 according to the present invention.

An emitter 102 is formed in a silicon substrate, such as a commercial silicon wafer. The emitter is n-doped. An emitter-base barrier (emitter barrier layer) 104 of $SiO_2$ and with a thickness of a few monolayers is deposited on emitter 102. In variants of this structure, the emitter-base barrier 104 as described above is replaced by other forms of tunnel diode, such as a Schottky diode, which is formed between the emitter and the base by a direct boundary layer which has been suitably processed.

In the example shown in FIG. 1, the emitter barrier layer 104 is followed by a graphene layer 106 having a thickness of only one or only a few atomic layers. A collector barrier layer 108 is desposited on the graphene layer. The collector barrier layer is made either of $SiO_2$ or of a dielectric material having a narrower band gap than the emitter barrier layer. The collector barrier layer is followed, in the direction of layer deposition, by the collector 110. In the present embodiment, the collector is made of n-doped silicon.

The three functional layers of the transistor are contacted with an emitter contact E, a base contact B and a collector contact K.

If the layers are suitably formed, the transistor may also be connected in the reverse order, i.e. with the substrate as the collector and the top contact as the emitter.

Details of the contacts have been left out in FIG. 1 for the sake of simple graphical presentation.

The emitter barrier layer blocks charge carrier transport between the emitter and the graphene layer when emitter-base voltages are below the first threshold voltage and lets a tunnel current flow between the emitter and the graphene layer when the emitter-base voltage is above the threshold voltage. A charge-carrying current can flow between the emitter and the collector when the voltage is above the threshold voltage. When emitter-collector voltages are below a second threshold voltage that is greater than or equal to the first threshold voltage, the collector barrier layer blocks charge carrier transport between the graphene layer and the collector.

Figure 2:
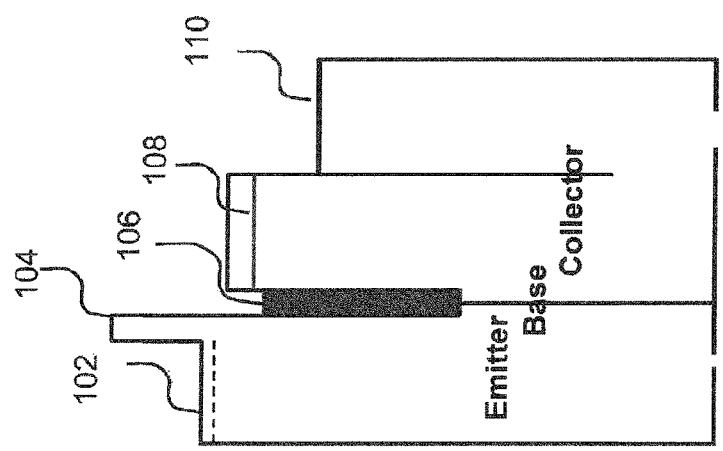

FIG. 2 shows a schematic band diagram of the transistor structure 100 in FIG. 1, in a de-energized state. The diagram mainly shows the conduction band edge of the various layers 102 bis 110 when the transistor is in a de-energized state. The tunnel barrier of the emitter barrier layer 104 can be seen. The broken lines shown in the emitter layer indicate the Fermi energy level. Two alternative lower edges of the conduction band are drawn for collector barrier layer 108. The higher energy level symbolizes $SiO_2$, whereas the lower energy level symbolizes a different material, for example a high-k dielectric.

Figure 3:
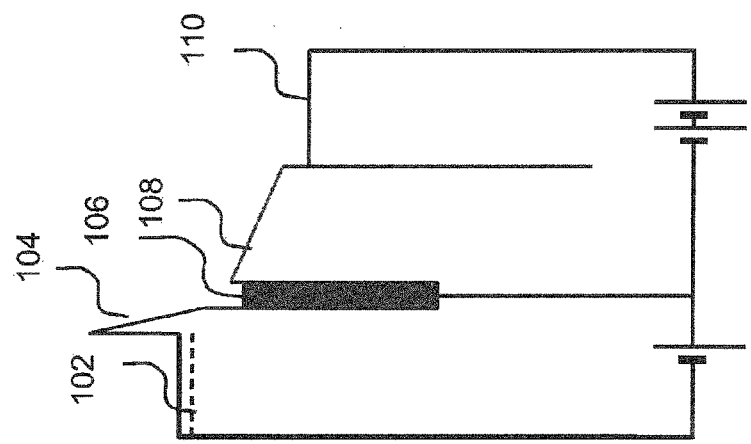
FIGS. 2 and 3 show band diagrams of depletion-layer transistors in different voltage states and material compositions.

FIG. 3 shows a band diagram similar to FIG. 2, for the case where an operating voltage applied between the emitter and the base permits a tunnel current, and where an emitter-collector voltage allows an emitter-collector current to flow past collector barrier 108.

It is possible with the structure shown here to achieve operating frequencies in the terahertz range.

Figure 4:
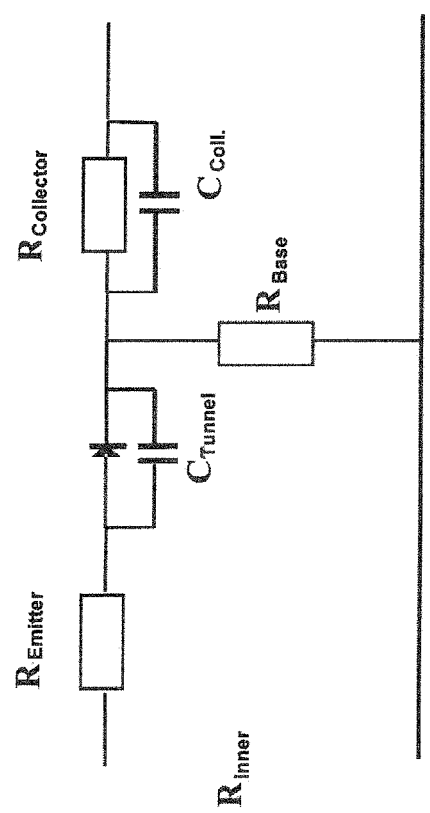
FIG. 4 shows an equivalent circuit diagram of the depletion-layer transistor in FIG. 1.

FIG. 4 shows an equivalent circuit diagram of the depletion-layer transistor 100 in FIG. 1. The internal resistance $R_{inner}$ of the transistor is characterized by the following variables:

an emitter resistance $R_{Emitter}$ which is dependent on the defect density in the emitter structure; this resistance can be kept low with a monocrystalline, low-defect embodiment of the emitter;

the blocking behavior of the tunnel diode between the emitter and the base;

a parasitic base-emitter capacitance $C_{Tunnel}$ of the tunnel diode, which is connected in parallel to the tunnel diode in this equivalent circuit diagram;

a collector resistance dependet on the embodiment of the collector barrier, and a parasitic base-collector capacitance connected parallel thereto; the latter can be kept low with measures described above; and the base resistance $R_{Base}$. This is particularly low due to the small layer thickness and the use of graphene as the base material.

What is claimed is:

1. A unipolar heterojunction depletion-layer transistor comprising a base, an emitter and a collector, in which the emitter contains a tunnel diode which permits a tunnel current of charge carriers from the emitter in the direction of the collector when an emitter-base voltage above a first threshold voltage is applied in the direction of current flow, and in which the base contains a metal conductive graphene layer.

2. The depletion-layer transistor according to claim 1, in which an emitter barrier layer is disposed between the graphene layer and the emitter and is configured to block charge carrier transport between the emitter and the graphene layer when emitter-base voltages are below the first threshold voltage, and to permit a tunnel current to flow between the emitter and the graphene layer when emitter-base voltages are above the threshold voltage.

3. The depletion-layer transistor according to claim 1, in which a collector barrier layer is disposed between the graphene layer and the collector.

4. The depletion-layer transistor according to claim 3, in which the emitter barrier layer is made of a first dielectric material and the collector barrier layer is made of a second dielectric material.

5. The depletion-layer transistor according to claim 4, in which a band gap between the valence band and the conduction band of the second dielectric material is the same width as that of the first dielectric material.

6. The depletion-layer transistor according to claim 4, in which a band gap between the valence band and the conduction band of the second dielectric material differs from that of the first dielectric material.

7. The depletion-layer transistor according to claim 2, in which the emitter barrier layer is made of silicon oxide or some other dielectric material.

8. The depletion-layer transistor according to claim 7, in which the emitter barrier layer and/or the collector barrier layer is either polycrystalline or monocrystalline.

9. The depletion-layer transistor according to claim 8, in which the layer thickness of the emitter barrier layer is a number of atomic layers.

10. The depletion-layer transistor according to claim 1, in which a boundary between the emitter and the base forms a Schottky diode, without an emitter barrier layer being deposited between the emitter and the base.

11. The depletion-layer transistor according to claim 1, in which the emitter layer is made either of a doped first semiconductor material of a first conductivity type or of a metal, and in which the collector is made of a metal or of a doped second semiconductor material of the first conductivity type.

12. The depletion-layer transistor according to claim 11, in which the first semiconductor material is silicon and the second semiconductor material is a silicon-germanium alloy or germanium.

13. The depletion-layer transistor according to claim 11, in which at least one of the first and second semiconductor materials is monocrystalline.

14. The depletion-layer transistor according to claim 11, in which at least one of the first and second semiconductor materials is polycrystalline or amorphous.

15. The depletion-layer transistor according to claim 1, in which the emitter or the collector or both the emitter and the collector are made of a metal oxide.

16. The depletion-layer transistor according to claim 1, in which the base consists of the graphene layer.

17. The depletion-layer transistor according to claim 12, in which at least one of the first and second semiconductor materials is monocrystalline.

18. The depletion-layer transistor according to claim 12, in which at least one of the first and second semiconductor materials is polycrystalline or amorphous.

* * * * *